US008560108B2

(12) United States Patent
Matsuyama et al.

(10) Patent No.: US 8,560,108 B2
(45) Date of Patent: Oct. 15, 2013

(54) SUBSTRATE PROCESSING APPARATUS AND SUBSTRATE PROCESSING METHOD

(75) Inventors: Kenichirou Matsuyama, Koshi (JP); Takeshi Matsumoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 306 days.

(21) Appl. No.: 12/971,171

(22) Filed: Dec. 17, 2010

(65) Prior Publication Data

US 2011/0206486 A1 Aug. 25, 2011

(30) Foreign Application Priority Data

Feb. 24, 2010 (JP) ................................. 2010-039093

(51) Int. Cl.
*B65H 1/00* (2006.01)
*G06F 19/00* (2011.01)

(52) U.S. Cl.
USPC ........ 700/112; 700/99; 700/121; 414/222.02; 414/222.08; 414/222.11; 414/222.13; 414/806; 414/935; 414/937

(58) Field of Classification Search
USPC .......... 700/99, 112, 121; 414/222.02, 222.08, 414/222.11, 222.13, 806, 935, 937
See application file for complete search history.

(56) References Cited

U.S. PATENT DOCUMENTS

| | | | | |
|---|---|---|---|---|
| 5,700,127 A | * | 12/1997 | Harada et al. | 414/416.08 |
| 6,535,784 B2 | * | 3/2003 | Joma et al. | 700/121 |
| 7,406,360 B2 | * | 7/2008 | Machiyama | 700/112 |
| 8,380,337 B2 | * | 2/2013 | Hiroki | 700/121 |
| 2005/0197729 A1 | * | 9/2005 | Higashi et al. | 700/112 |
| 2006/0165408 A1 | * | 7/2006 | Akimoto et al. | 396/564 |
| 2009/0016860 A1 | * | 1/2009 | Kaneko et al. | 414/222.11 |
| 2010/0021621 A1 | * | 1/2010 | Hayashida et al. | 427/8 |

FOREIGN PATENT DOCUMENTS

| | | |
|---|---|---|
| JP | 2006-203003 A1 | 8/2006 |
| JP | 2009-278138 A1 | 11/2009 |

OTHER PUBLICATIONS

Japanese Office Action dated Mar. 13, 2012 (with English translation).

* cited by examiner

*Primary Examiner* — Mohammad Ali
*Assistant Examiner* — Jennifer L Norton
(74) *Attorney, Agent, or Firm* — Burr & Brown

(57) ABSTRACT

Even when a module constituting a multi-module becomes an unavailable module, transfer of substrates can be promptly performed, while restricting generation of inferior products. When a destination module of a multi-module becomes unavailable before a substrate is transferred to the destination module, a destination of the substrate is changed to a module to which a substrate subsequent to the substrate is to be loaded. Upon generation of an unavailable module, before the transfer unit accesses the module on an upstream end of the transfer cycle, the transfer cycle proceeds until a precedent substrate becomes ready to be unloaded from the changed destination module. Alternatively, upon generation of an unavailable module, when the transfer unit is located on an upstream side of the unavailable module in the transfer cycle, the transfer operation of the transfer unit is made standby until a precedent substrate becomes ready to be unloaded in the changed destination module.

4 Claims, 17 Drawing Sheets

|  |  |  |  | B3 |
|---|---|---|---|---|
| GHP35 | GHP36 | GHP37 | GHP38 | GHP32 |
| GHP31 | GHP32 | GHP33 | GHP34 | GHP31 |

| BF3 |
|---|
| CPL33 |
| CPL32 |
| CPL31 |

| COT1 | COT2 | COT3 | COT4 |

FIG.5

| STEP | MODULE |
|---|---|
| 1 | CPL |
| 2 | COT |
| 3 | GHP |
| 4 | BF3 |

| CPL | | | COT | | | | GHP | | | | |
|---|---|---|---|---|---|---|---|---|---|---|---|
| 31 | 32 | 33 | 1 | 2 | 3 | 4 | 31 | 32 | 33 | 34 | 35 |
| W5 | W6 | W7 | W1 | W2 | W3 | W4 | WAIT | | | | |
| OUT | | | | OUT | | | IN | WAIT | | | |
| IN | WAIT | | | IN | | | | | | | |
| W8 | OUT | WAIT | | W5 | OUT | | W2 | IN | WAIT | | |
| | IN | | | | IN | | | W3 | | | |
| | W9 | OUT | | | W6 | OUT | | | IN | WAIT | |
| | | IN | | | | IN | | | | | |
| | | W10 | | | | W7 | | | | W4 | WAIT |

(b)

| CPL | | | COT | | | | GHP | | | | |
|---|---|---|---|---|---|---|---|---|---|---|---|
| 31 | 32 | 33 | 1 | 2 | 3 | 4 | 31 | 32 | 33 | 34 | 35 |
| W5 | W6 | W7 | W1 | W2 | W3 | W4 | WAIT | | | | |
| OUT | | | | | | | IN | WAIT | | | |
| IN | | | | OUT | | | | | | | |
| W8 | WAIT | | | IN | | | W2 | IN | WAIT | | |
| | | | | W5 | OUT | | | W3 | | | |
| OUT | | | | | IN | | | | IN | WAIT | |
| IN | WAIT | | | | W6 | OUT | | | | | |
| W9 | OUT | | | | | IN | | | | W4 | WAIT |
| | IN | | | | | W7 | | | | | |
| | W10 | | | | | | | | | | |

| CPL | | | COT | | | | GHP | | | | |
|---|---|---|---|---|---|---|---|---|---|---|---|
| 31 | 32 | 33 | 1 | 2 | 3 | 4 | 31 | 32 | 33 | 34 | 35 |
| W5 | W6 | W7 | W1 | W2 | W3 | W4 | WAIT | WAIT | WAIT | WAIT | |
| WAIT | WAIT | | | | OUT | | | IN | | | |
| OUT | | | | | IN | | | | | | |
| IN | | WAIT | | | | OUT | | W3 | | | |
| W8 | OUT | | | | W5 | IN | | | | | |
| | IN | | | | | W7 | | W4 | | | |
| | W9 | | | | | | | | | | |

(b)

| CPL | | | COT | | | | GHP | | | | |
|---|---|---|---|---|---|---|---|---|---|---|---|
| 31 | 32 | 33 | 1 | 2 | 3 | 4 | 31 | 32 | 33 | 34 | 35 |
| W5 | W6 | W7 | W1 | W2 | W3 | W4 | WAIT | WAIT | WAIT | WAIT | |
| OUT | | | | | | | IN | | | | |
| IN | | | | | | | | | | | |
| W8 | WAIT | | | | OUT | | | W3 | | | |
| | | WAIT | | | IN | | | | | | |
| OUT | OUT | | | | W5 | OUT | | IN | WAIT | | |
| IN | IN | | | | | IN | | W4 | | WAIT | |
| W11 | W19 | | | | | W7 | | | | | |

FIG.12

(a)
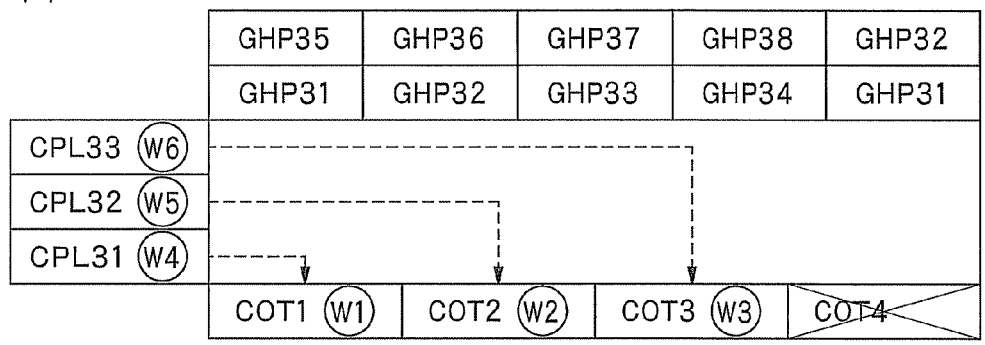
(b)
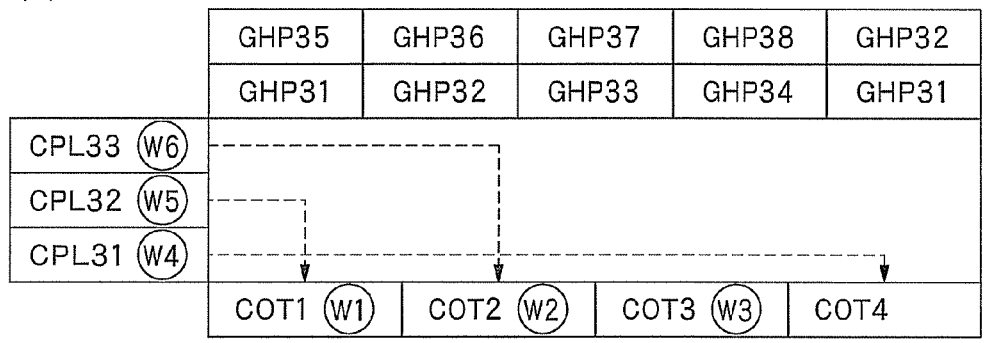
FIG.17

SUBSTRATE PROCESSING APPARATUS AND SUBSTRATE PROCESSING METHOD

CROSS REFERENCE TO RELATED APPLICATIONS

This application is based upon and claims the benefit of priority from the prior Japanese Patent Application No. 2010-039093 filed on Feb. 24, 2010 the entire contents of which are incorporated herein by reference.

BACKGROUND OF THE INVENTION

1. Field Of The Invention

The present invention relates to a substrate processing apparatus and a substrate processing method, which supply a process liquid onto a surface of a substrate, such as a semiconductor substrate or an LCD substrate (a glass substrate for a liquid crystal display), so as to perform a predetermined substrate process, such as an application of a resist liquid or a development after exposure.

2. Description Of Related Art

In a manufacturing process of a semiconductor device and an LCD substrate, a resist pattern is formed on a substrate by a technique called photolithography. This technique is performed by a series of steps. Namely, a resist liquid is coated to a semiconductor wafer (hereinafter referred to as "wafer"), for example, so as to form a liquid film on a surface of the wafer. Then, the resist film is exposed by using a photomask, and thereafter the exposed resist film is developed, whereby a desired pattern is obtained This process is performed by a resist-pattern forming apparatus generally formed by connecting an exposure apparatus to a coating and developing apparatus that coats a resist liquid and develops the same. As shown in FIG. 18, in this apparatus, wafers are transferred by a transfer arm 12 from a carrier 10, which accommodates therein a large number of wafers, to a processing part 1B. Within the processing part 1B, an anti-reflection film is formed in an anti-reflection film forming module (not shown), and a resist film is formed in a coating module 13. Thereafter, the wafers are transferred to an exposure apparatus 1D through an interface part 1C. The exposed wafers are returned again to the processing part 1B, and are subjected to a developing process in a developing module 14. After that, the wafers are returned to the original carrier 10. Before and after the process for forming an anti-reflection film and the process for forming a resist film, and before and after the developing process, the wafers are subjected to a heating process and a cooling process by heating modules and cooling modules, which are arranged at multiple levels in shelf modules 15a to 15c.

In the processing part 1B, the wafers are transferred by main arms 16A and 16B between the respective modules. When the wafers are subjected to the aforementioned processes, a program has been previously made such that the wafers are transferred along a predetermined route. Namely, a transfer schedule, which determines, for all the wafers to be processed, transfer timings and modules to which the wafers are transferred, is stored in a memory. Thus, the wafers are transferred in accordance with the transfer schedule. A location on which the wafer is placed is referred to as "module". In the transfer schedule, order numbers are allocated to the wafers, and transfer cycle data are chronologically arranged in which transfer cycles are specified based on a relationship between the order of the wafers and the order of the modules.

From the aspect of improving a throughput, a multi-module is usually set in the resist-pattern forming apparatus. The multi-module includes a plurality of modules that have the same transfer order, and perform the same process to wafers. There is a possibility that a certain module constituting the multi-module might become unavailable because of a trouble or lack of proper maintenance. A transfer of wafers in this case is proposed by Patent Document 1, for example. According to this method, a wafer to be transferred to the unavailable module is once transferred to a retraction module. Then, after another wafer has been processed in another available module constituting the multi-module, the wafer having been retracted to, the retraction module is transferred to the available module.

However, in order to improve a throughput, since the processing part 1B has been recently required to incorporate a large number of modules for processes, it becomes difficult to reserve a space in which the retraction module can be installed. In addition, in the multi-module, there is a possibility that a plurality of modules might be simultaneously subjected to a maintenance, such as an exchange of chemical liquids and a pump maintenance, and/or a nozzle trouble might be simultaneously occur in a plurality of modules. In order to cope with the case in which the plurality of modules become unavailable, it is necessary to prepare a plurality of retraction modules. However, it is difficult to reserve such a space.

It can be considered that a wafer is once retracted to a transfer stage, instead of the retraction module, which is incorporated in the transfer schedule. However, in this case, wafers cannot be transferred in accordance with the transfer cycles written in the transfer schedule, whereby the transfer of the wafers may be stopped or delayed. In this case, some wafers may stagnate in, for example, the heating modules, and the wafers may be overheated in the modules. Namely, a film quality is deteriorated, resulting in inferior wafers as products.

Patent Document 1: 3P2006-203003A (paragraphs 0037 to 0039)

SUMMARY OF THE INVENTION

The present invention has been made in view of the above circumstances. The object of the present invention is to provide a technique that can transfer substrates promptly, even when a certain module constituting the multi-module becomes an unavailable module, by changing destinations of the substrates to available modules, whereby generation of inferior substrates as products can be restrained.

[1]The present invention is a substrate processing apparatus comprising: a plurality of module groups each including a plurality modules, at least one module group including a multi-module having a plurality of modules configured to perform the same process to substrates; a transfer unit configured to take out substrates from modules on an upstream side of the multi-module, to transfer the substrates to modules in the multi-module, and to take in the substrates to the respective modules in the multi-module in order; a storage part storing a transfer schedule including a transfer cycle by which the substrates are transferred by the transfer unit to the respective modules in the multi-module; and a control part that controls the transfer unit based on the transfer schedule in the storage part; wherein, when at least one of the modules constituting the multi-module is an unavailable module, the control part is configured to perform the following operations (1) and (2):
(1) upon generation of the unavailable module, when the transfer unit is located on downstream side of the unavailable module in the transfer cycle, or before the transfer unit accesses the module on an upstream end of the transfer cycle:

(1-a) a destination of the substrate, which is to be loaded into the unavailable module and is now placed on the upstream side of the multi-module, is changed to a module in the multi-group, to which a substrate subsequent to the substrate is to be transferred;

(1-b) when the module to which the substrate subsequent to the substrate is to be transferred is an unavailable module, another module to which a further subsequent substrate is searched so as to find an available module, and the available module is determined as the destination; and (1-c) when a preceding substrate is not yet ready to be unloaded from the destination module as determined above, the transfer cycle proceeds until the substrate becomes ready to be unloaded, without making standby the transfer unit; and (2) upon generation of the unavailable module, when the transfer cycle has been already started, and the transfer unit is located on the upstream side of the unavailable module in the transfer cycle:

(2-a) a destination of the substrate, which is to be loaded into the unavailable module and is now placed on a multi-module on the upstream side of the multi-module, is changed to a module in the multi-module, to which a substrate subsequent to the substrate is to be transferred;

(2-b) when the module to which the substrate subsequent to the substrate is to be transferred is an unavailable module, another module to which a further subsequent substrate is to be transferred is searched so as to find an available module, and the available module is determined as the destination; and (2-c) when a precedent substrate is not yet ready to be unloaded from the destination module as determined above, the transfer operation of the transfer unit is made standby on the upstream side of the module determined as the destination.

The present invention is the substrate processing apparatus of [1], wherein: the module groups include a module group for forming a coating film on a substrate before exposure, and a module group for performing a process, including a developing process, to a substrate after exposure; the transfer unit includes a transfer unit for the module group for forming a coating film, and a transfer unit for the module group for performing a process including a developing process; and the module group including the multi-module is the module group for forming a coating film on a substrate before exposure.

The present invention is the substrate processing apparatus of [1] wherein: the module groups include a module group for forming a coating film on a substrate before exposure, and a module group for performing a process, including a developing process, to a substrate after exposure; the transfer unit includes a transfer unit for the module group for forming a coating film, and a transfer unit for the module group for performing a process including a developing process; and the module group including the multi-module is the module group for performing a process including a developing process.

The present invention is a substrate processing method of a substrate processing apparatus comprising a plurality of module groups each including a plurality modules, at least one module group including a multi-module having a plurality of modules configured to perform the same process to substrates; a transfer unit configured to take out substrates from modules on an upstream side of the multi-module, to transfer the substrates to modules in the multi-module, and to take in the substrates to the respective modules in the multi-module in order; a storage part storing a transfer schedule including a transfer cycle by which the substrates are transferred by the transfer unit to the respective modules in the multi-module; and a control part that controls the transfer unit based on the transfer schedule in the storage part; the substrate processing method comprising: controlling the transfer unit based on the transfer schedule in the storage part, such that substrates are taken out from modules on the upstream side of the multi-module, that the substrates are transferred to modules in the multi-module, and that the substrates are transferred to the respective modules in the multi-module in order; and when at least one of the modules constituting the multi-module is an unavailable module, performing the following operations (1) and (2):

(1) upon generation of the unavailable module, when the transfer unit is located on a downstream side of the unavailable module in the transfer cycle, or before the transfer unit accesses the module on an upstream end of the transfer cycle:

(1-a) a destination of the substrate, which is to be loaded into the unavailable module and is now placed on the upstream side of the multi-module, is changed to a module in the multi-group, to which a substrate subsequent to the substrate is to be transferred;

(1-b) when the module to which the substrate subsequent to the substrate is to be transferred is an unavailable module, another module to which a further subsequent substrate is searched so as to find an available module, and the available module is determined as the destination; and (1-c) when a precedent substrate is not yet ready to be unloaded from the destination module as determined above, the transfer cycle proceeds until the substrate becomes ready to be unloaded, without making standby the transfer unit; and (2) upon generation of the unavailable module, when the transfer cycle has been already started, and the transfer unit is located on the upstream side of the unavailable module in the transfer cycle:

(2-a) a destination of the substrate, which is to be loaded into the unavailable module and is now placed on a multi-module on the upstream side of the multi-module, is changed to a module in the multi-module, to which a substrate subsequent to the substrate is to be transferred;

(2-b) when the module to which the substrate subsequent to the substrate is to be transferred is an unavailable module, another module to which a further subsequent substrate is to be transferred is searched so as to find an available module, and the available module is determined as the destination; and (2-c) when a precedent substrate is not yet ready to be unloaded from the destination module as determined above, the transfer operation of the transfer unit is made standby on the upstream side of the module determined as the destination.

According to the present invention, when at least one of a plurality module constituting a multi-module becomes an unavailable module and at least one of the modules is available, a destination of a substrate is changed to the available module to which a substrate subsequent to the substrate is to be transferred, whereby substrates are promptly transferred. Thus, it is possible to restrain generation of inferior substrates as products, which is cased by stagnation of a substrate in a module.

BRIEF DESCRIPTION OF THE DRAWINGS

FIG. 5 is a structural view showing an example of a module group in a third block of the resist-pattern forming apparatus.

FIG. 6 is an explanatory view showing an example of a transfer recipe in the third block.

FIGS. 11(a) and 11(b) are explanatory views showing an example of the wafer transfer and an example of the transfer schedule in the third block.

FIGS. 12(a) and 12(b) are explanatory views showing an example of the wafer transfer and an example of the transfer schedule in the third block.

FIGS. 17(a) and 17(b) are explanatory views showing an example of the wafer transfer in the third block.

DETAILED DESCRIPTION OF THE INVENTION

Figure 1:
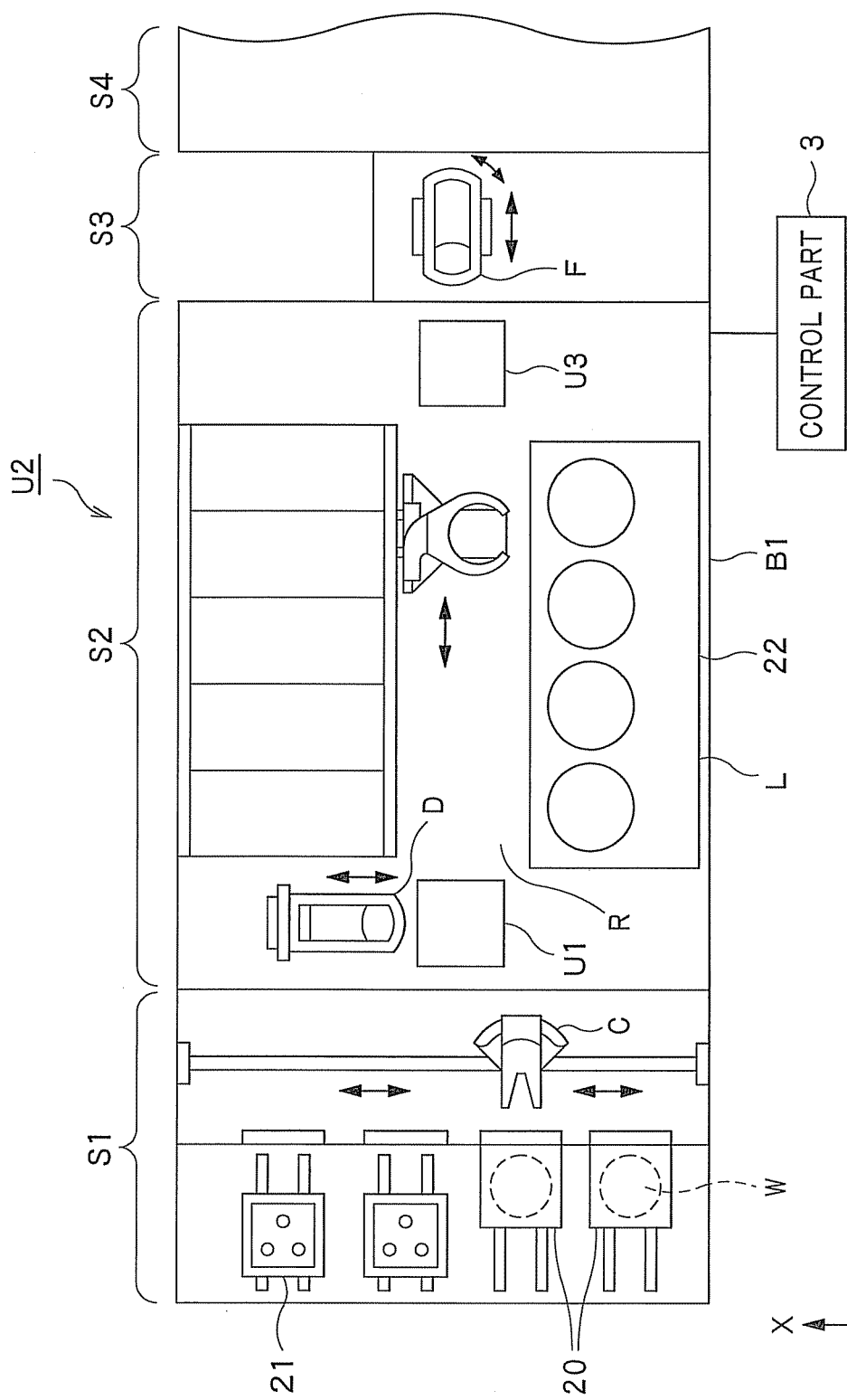
FIG. 1 is a plan view showing a plan view showing a resist-pattern forming apparatus in one embodiment according to the present invention.
Figure 2:
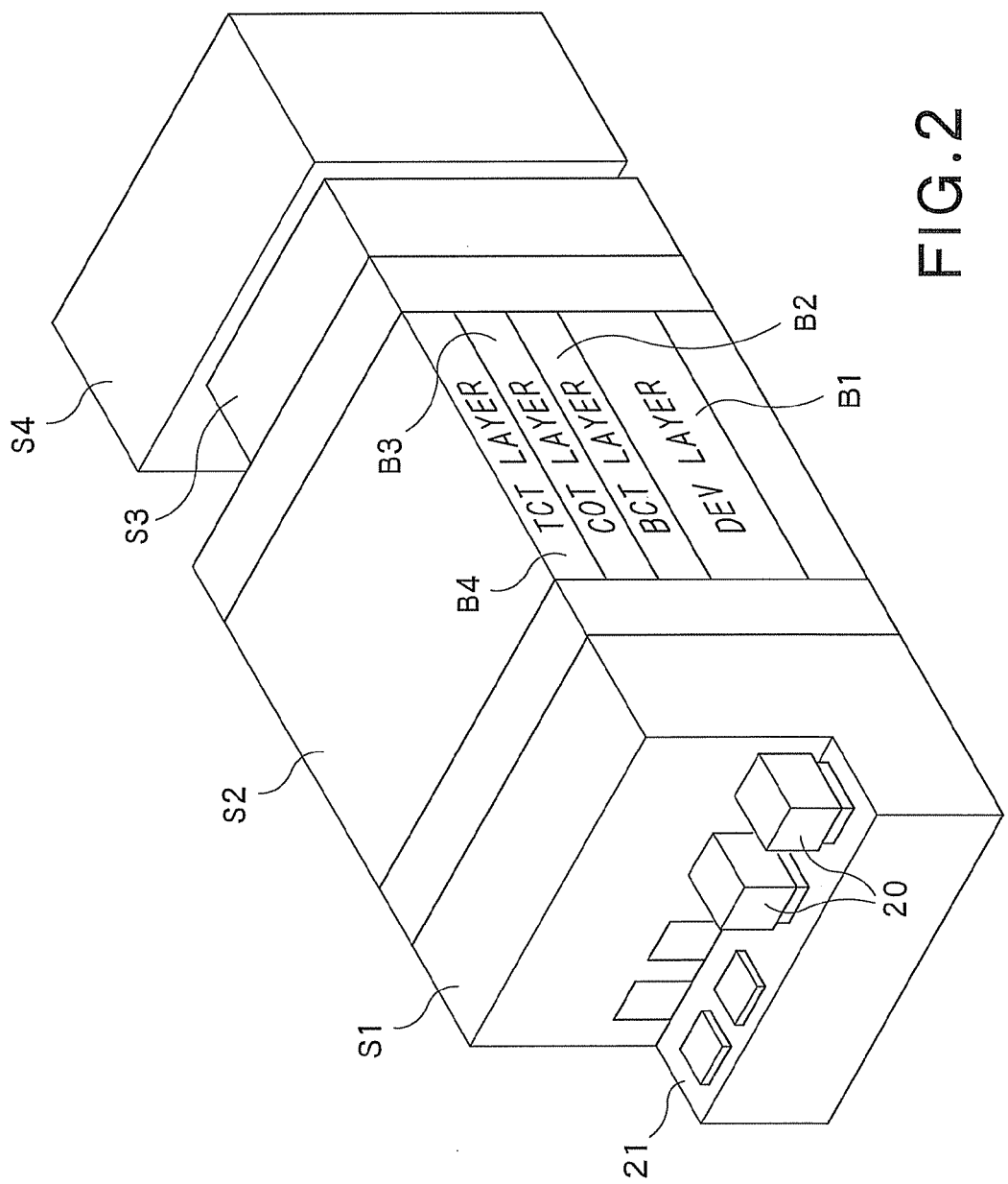
FIG. 2 is a perspective view of the resist-pattern forming apparatus.

An example of a resist pattern forming apparatus of the present invention, in which an exposure apparatus is connected to a developing apparatus, is briefly described with reference to the drawings. FIG. 1 is a plan view showing a plan view showing a resist-pattern forming apparatus in one embodiment according to the present invention, and FIG. 2 is a perspective view thereof. The apparatus includes a carrier block S1, a processing block S2, an interface block S3, and an exposure apparatus S4. In the carrier block S1, a conveying means C is configured to take a wafer W out of a carrier 20 of a hermetically sealing type, which is placed on a table 21, and to transfer the wafer W to the processing block S2 adjacent to the block S1. Then, the conveying means C is configured to receive the wafer W which has been processed in the processing block S2, and to return the wafer W to the carrier 20.

As shown in FIG. 2, in this example, the processing block S2 is formed by stacking a first block (DEV layer) B1, a second block (BCT layer) B2, a third block (COT layer) B3, and a fourth block (TCT layer) B4, in this order from below. The first block B1 is configured to perform a developing process. The second block B2 is configured to form an anti-reflection film below a resist film. The third block B3 is configured to perform a coating process of a resist liquid. The fourth layer B4 is configured to form an anti-reflection film above the resist film.

The first to fourth blocks B1 to B4 have substantially the same structure. Each of the blocks B1 to B4 includes: a shelf unit U1 in which transfer modules where wafers W are transferred to and from the other blocks are arranged at multiple levels; a liquid processing module group L having a plurality of liquid processing modules each for coating a chemical liquid; and a shelf unit U2 in which heating and cooling modules are arranged at multiple levels, the modules being configured to perform a preprocess and a postprocess of a process performed in the liquid processing module group L. The first to fourth blocks B1 to B4 respectively has transfer arms A1 to A4 serving as transfer units for transferring the wafers W between the respective shelf units U1 and U2 and the respective modules of the liquid processing module group L. (see FIG. 3).

As shown in FIG. 1, for example, each of the first to fourth blocks B1 to B4 is provided with a transfer path R extending in a Y direction. The transfer arms A1 to A4 are capable of moving in a fore and aft direction, moving in a vertical direction, rotating about a vertical axis, and moving in the Y-axis direction. Each of the transfer arms A1 to A4 has two forks for supporting a rear-side peripheral area of the wafer W. The two forks are capable of moving independently from each other.

The liquid processing module group L and the shelf unit U2 are located opposedly to each other along the transfer path R. In each of the second to fourth blocks B2 to B4, the liquid processing, module group L includes a plurality of, e.g., four liquid processing modules that are arranged along the transfer path R. As these liquid processing modules, liquid processing modules BCT that coat a chemical liquid for forming an anti-reflection film below a resist are disposed in the second block B2, liquid processing modules COT that coat a resist liquid are disposed in the third block B3, and liquid processing modules TCT that coat a chemical liquid for forming an anti-reflection film above the resist are disposed in the fourth block B4, respectively. In the first block B1, for example, four liquid processing modules DEV are arranged at two levels along the transfer path R within the liquid processing module group L. In the liquid processing module group L, a developer is coated as a chemical liquid.

Figure 3:
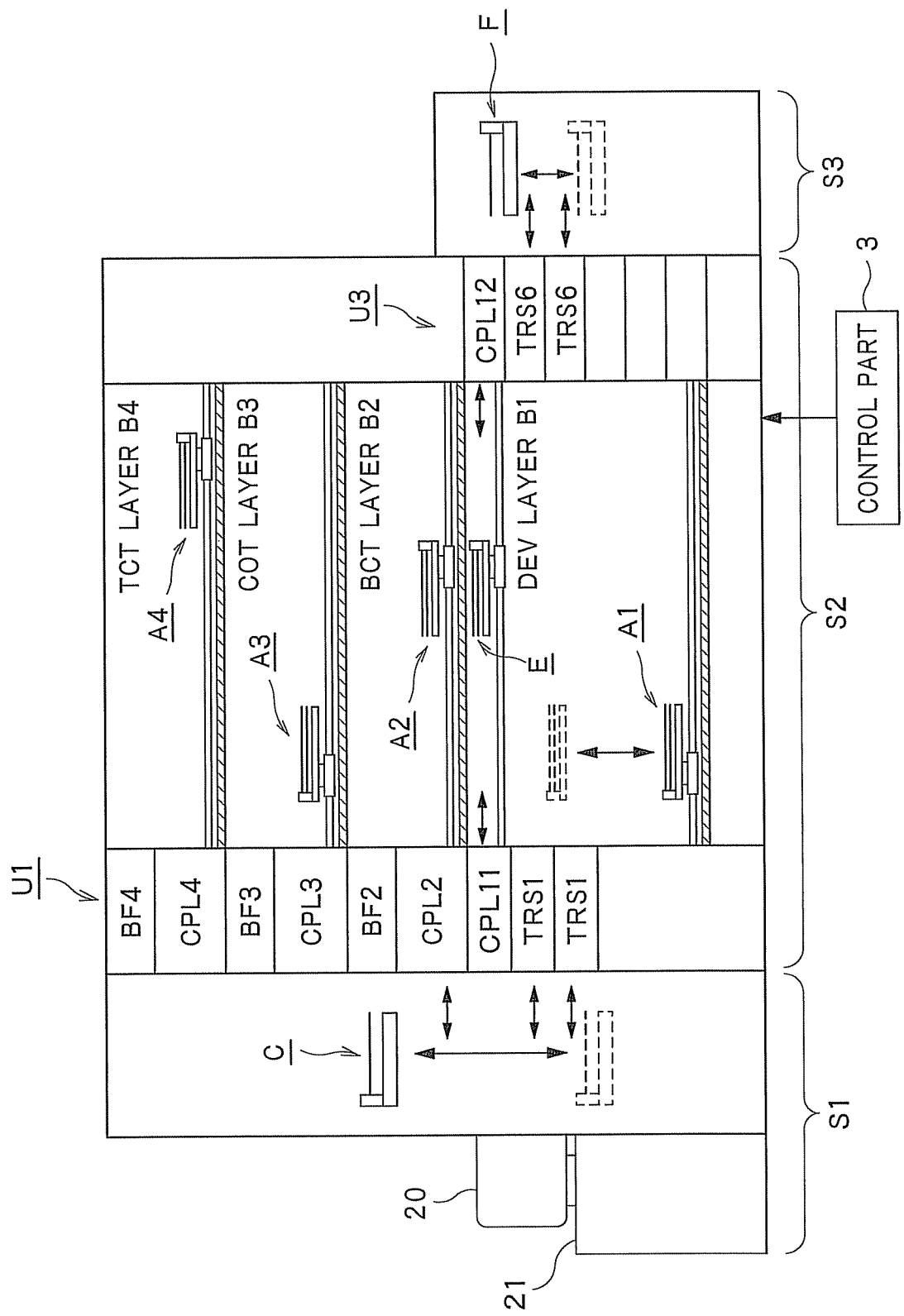
FIG. 3 is a side-sectional view showing the resist-pattern forming apparatus.

As shown in FIGS. 1 and 3, the shelf unit U1 is configured to transfer the wafer W between the respective parts of the shelf unit U1 by a vertically movable conveying arm D disposed adjacently to the shelf unit U1. In the shelf unit U1, transfer modules CPL serving also as cooling units for adjusting a temperature, and transfer modules BF serving also as a buffer on which a plurality of wafers W can be placed, are arranged at multiple levels. In the shelf unit U2, heating modules GHP and GHA for heating the wafers W are incorporated. The first block (DEV layer) B1 is provided with a shelf unit U3 on a side of the interface block S3. In the shelf unit U3, transfer modules CPL and TRS to be used for transferring the wafers W between the block B1 and the interface block S3 are arranged at multiple levels.

A flow example of the wafer W in the above coating and developing apparatus is described. A wafer W from the carrier block Si is transferred by the conveying means C to one of the transfer modules of the shelf unit U1, e.g., the corresponding transfer module CPL2 of the second block B2. Then, in the second block B2, the wafer W is transferred by the transfer arm A2 to the liquid processing module BCT, the heating module GHA, and the transfer module BF2 of the shelf unit U1, in this order, whereby an anti-reflection film is formed on the wafer W.

Thereafter, the wafer W is transferred by the conveying arm D to the transfer module CPL3 of the shelf unit U1. Then, in the third block B3, the wafer W is transferred by the transfer arm A3 to the liquid processing module COT, the heating module GHA, and the transfer module BF3 of the shelf unit U1, in this order, whereby a resist film is formed on the anti-reflection film of the wafer W. There is a case in which the wafer W, on which the resist film has been formed, is subjected to a further anti-reflection film forming process in the fourth block B4. In this case, the wafer W is transferred to the transfer arm A4 via the transfer module CPL4. After an anti-reflection film has been formed, the wafer W is transferred by the transfer arm A4 to the transfer module BF4.

On the other hand, in an upper part of the first block B1, there is disposed a shuttle arm E that is a dedicated transfer unit for directly transfer the wafer W from the transfer module CPL11 of the shelf unit U1 to the transfer module CPL12 of the shelf unit U3. The wafer W, on which the resist film and the further anti-reflection film have been formed, is transferred by the conveying arm D to the transfer module CPL11 via the transfer modules BF3 and BF4. From the transfer module CPL11 of the shelf unit U1, the wafer W is directly transferred by the shuttle arm E to the transfer module CPL12 of the shelf unit 3 so as to be taken into the interface block B3.

Then, the wafer W is transferred by an interface arm F to the exposure apparatus S4, and is subjected to a predetermined exposure process. Thereafter, the wafer W is placed on the transfer module TRS6 of the shelf unit U3, and is returned to the processing block S2. The returned wafer W is subjected to a developing process in the first block B1, and is transferred by the transfer arm A1 to the transfer module TRS1 to which the conveying means C of the shelf unit U can access. Then, the wafer W is returned to the carrier 20 via the conveying means C.

At this time, wafers W are transferred to the respective module groups in the first to fourth blocks B1 to B4, by the transfer arms A1 to A4 in the respective blocks, in accordance with a transfer schedule, which is described below. In each of the blocks B1 to B4, the transfer arms A1 to A4 dedicated for each module group take out a wafer W from a certain module, receives another wafer W in the next module, and transfers the former wafer W to the next modules. Namely, by moving the wafers W placed on the respective modules to the modules subsequent to the modules by one, one transfer cycle is performed. After the one transfer cycle has been performed, a next transfer cycle is performed. By sequentially performing the transfer cycles, the wafers W are sequentially transferred from the modules of a smaller order to the modules of a larger order of the module group, whereby a predetermined process is performed.

In the respective processing blocks B1 to B4, each of the transfer arms A1 to A4 is configured to receive a wafer from the transfer module CPL of the shelf unit U1, which is a module on an upstream end of the transfer cycle, and to transfer the wafer to the transfer module BF on a downstream end of the transfer cycle, along the aforementioned transfer route. Thus, the transfer cycles are performed in the respective processing blocks B1 to B4.

The aforementioned resist-pattern forming apparatus is equipped with a control part 3 formed of a computer that controls management of recipes of the respective modules, management of recipes of a transfer flow (transfer route) of the wafer W, processes in the respective modules, and drive of the conveying means C, the conveying arm D, the transfer arms A1 to A4, the shuttle arm E, and the interface arm F. The control part 3 includes a program formed of, e.g., a software including steps (commands) such that processes in the respective modules and transfer of the wafers W, which are performed for carrying out for the operation of the resist-pattern forming apparatus as a whole, i.e., for forming a resist pattern on each wafer W, are performed. When the program is read out by the control part 3, the operation of the resist-pattern forming apparatus as a whole is controlled by the control part. The program is stored in a storage medium such as a flexible disc, a hard disc, a compact disc, a magnetoptical disc, or a memory card, and installed.

Figure 4:
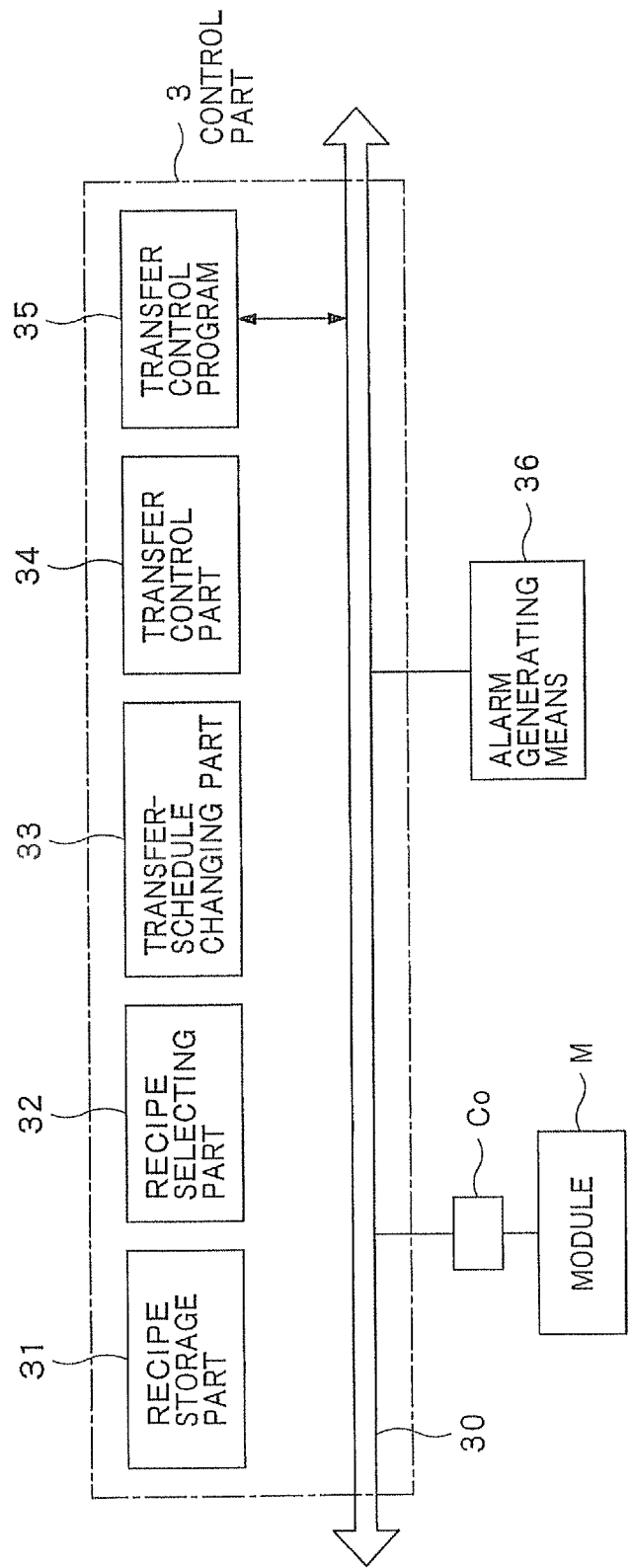
FIG. 4 is a structural view showing an example of a control part of the resist-pattern forming apparatus.

FIG. 4 shows the structure of the control part 3. The control part 3 is actually composed of a CPU (central module), a program and a memory. However, since the characteristic feature of the present invention resides in transfer of wafers W when a module becomes unavailable, a part of the structural elements relating thereto is described as a block.

In FIG. 4, the reference number 30 depicts a bus. Connected to the bus 30 are a recipe storage part 31, a recipe selecting part 32, a transfer-schedule changing part 33, a transfer control part 34, a transfer control program 35, and an alarm generating means 36. Each module M is connected to the control part 3 via a controller Co. When a trouble occurs in the module M, an alarm signal is outputted from the module M to the control part 3 through the controller Co. The module M includes all the modules incorporated in the shelf units U1 to U3 and the liquid processing modules.

The recipe storage part 31 is a section corresponding to a memory part. In the recipe storage part 31, there are stored, for example, a transfer recipe recording a transfer route of the wafer W, a transfer schedule that determines, for all the wafers W in a lot, timings and modules to which the wafers W are transferred, and a plurality of recipes recording processing conditions to the wafers W. The recipe selecting part 32 is a section that selects a suitable one out of the recipes stored in the recipe storage part 31. The recipe selecting part 32 can also select a module M to be used.

The transfer-schedule changing part 33 is a section that changes a transfer schedule, during a transfer of a wafer W, when a module to which the wafer W is to be transferred becomes an unavailable module, which is described below. The transfer control part 34 is a means that refers to the transfer schedule, and controls the conveying means C, the conveying arm D, the transfer arms A1 and A2, the shuttle arm E, and the interface arm F, such that wafers which are written in transfer cycle data are transferred to corresponding modules, so as to perform the transfer cycles. The transfer control program 35 is a program that is driven, during a transfer of a wafer W, when a module to which the wafer W is to be transferred becomes an unavailable module. When troubles occur in respective modules, for example, the program is driven based on alarm signals outputted from the respective modules via the controllers Co. When an unavailable module generates, an alarm is outputted by the alarm generating means 36, and whether a destination module can be changed or not is judged. When the destination module can be changed, the transfer schedule is changed by the transfer-schedule changing part 33. Then, a transfer of the wafers W by the transfer arms A1 to A4 is controlled by the transfer control unit 34, such that the wafers are transferred in accordance with the new transfer schedule. On the other hand, when the destination module cannot be changed, a command is outputted by the transfer control part 34 to the transfer arms A1 to A4, so as to stop the transfer of the wafers W. Alternatively, the transfer of the wafers on the downstream side of the unavailable module is performed. The alarm generating means 36 generates an alarm, by turning on a lamp, issuing an alarm sound, or displaying an alarm on a display screen.

The unavailable module is a module into which a wafer cannot be loaded because the module has a trouble or the module should be maintained. The case in which the destination module can be changed means a case in which at least one of the plurality of modules constituting the multi-module is available. At this time, the multi-module is composed of, among a plurality of modules on which wafers can be placed in accordance with a determined transfer order, modules having the same transfer order and configured to perform the same process to the wafers, i.e., the modules set in the same step of the transfer recipe.

The case in which the destination module cannot be changed means a case in which only one module is set in the same step of the transfer recipe, or there is no available module, although a plurality of modules are set in the same step of the transfer recipe.

FIG. 5 shows an example of the module group disposed in the third block B3 (hereinafter referred to as "COT layer B3"). In the shelf unit U1, there are provided three transfer modules CPL 31 to 33 that are used when wafers are loaded into the COT layer B3, and one transfer module BF3 that is used when wafers are unloaded from the COT layer B3. The transfer module BF3 is structured such that a plurality of wafers can be placed therein at multiple levels. The liquid processing module group L includes the four liquid processing modules COT1 to COT4. In the shelf unit U2, there are arranged eight heating modules GHP31 to GHP 38, and two heating modules GHA 31 and GHA32.

In this example, each of the liquid processing modules COT1 to COT4 includes therein a substrate holding part in which a substrate is placed substantially horizontally, and a cup surrounding the substrate holding part. The substrate holding part is referred to as "module". All the modules in the COT layer B3 corresponds to the module group for forming a coating film on the substrate before exposure. Not all the modules are used, but a module to be used is selected depending on a process recipe.

FIG. 6 shows an example of the transfer recipe of the COT layer B3. The three transfer modules CPL31 to CPL33 are used in a step 1 of the transfer recipe, the four liquid processing modules COT1 to COT4 are used in a step 2, and the five heating modules GHP31 to GHP35 are used in a step 3, respectively. Thus, in the COT layer B3, a multi-module is constituted by the transfer modules CPL31 to CPL33 of the step 1, a multi-module is constituted by the liquid processing modules COT1 to COT4 of the step 2, and a multi-module is constituted by the heating modules GHP31 to GHP35 of the step 3.

A normal transfer schedule is described with reference to FIG. 7. The transfer schedule shows a part of a transfer schedule in the COT layer B3, which is made based on the transfer recipe shown in FIG. 6 and the modules to be used. In the COT layer B3, wafers W are transferred in accordance with the transfer schedule. Namely, in the normal condition, the wafers are distributed to the respective modules of the multimodules, e.g., wafers are transferred to the liquid processing modules COT1 to COT4, from the transfer modules CPL31 to CPL 33 as former modules thereof, in a predetermined order. In a cycle 1, a first wafer W1 in the lot is loaded by the conveying arm D into the transfer module CPL31 of the initial step 1 of the transfer recipe. In a cycle 4, the wafer W1 transferred to the liquid processing module COT 1 of the succeeding step 2. In a cycle 8, the wafer W1 is transferred to the heating module GHP31 of the succeeding step 3. In a cycle 13, the wafer W1 is transferred to the transfer module BF3 of the last step 4. The wafer W in the transfer module BF3 is transferred by the conveying arm D to the other block B1 (B4) that performs a succeeding process. Hereafter, the respective modules are written as CPL, COT, GHP and BF.

An operation of the transfer arm A3 in the cycle 13 is described. After the transfer arm A3 has unloaded a wafer W10 from CPL31 by using one of the forks, the transfer arm A3 moves to the COT4. The transfer arm A3 unloads a wafer W6 in the COT 4 by using the other fork, and then loads the wafer W10 on the one fork into the COT4. Then, the transfer arm A moves to the GHP31. The transfer arm A3 unloads the wafer W1 in the GHP31 by using the one fork, and thereafter the transfer arm A3 loads the wafer W6 on the other fork into the GHP31. Then, the transfer arm A3 moves to the BF3, and transfers the wafer W1 on the one fork to the BF3.

Next, changing of the transfer schedule by the transferschedule changing part 33 is described. The transfer schedule is changed depending on the following cases (1) and (2). At first, the case (1) is described.

Upon generation of an unavailable module, when the transfer arms A1 to A4 are located on the downstream side of the unavailable module in the transfer cycle, or before the transfer arms A1 to A4 access the module on the upstream end of the transfer cycle, a new transfer schedule is made such that the following conditions are satisfied.

(1-a) A destination of a wafer W, which is to be loaded into the unavailable module and is now placed on a module (module from which the wafer is transferred (origination module)) precedent to the unavailable module by one, is changed to a module (a module to which the wafer W is transferred (destination module)) to which a wafer W subsequent to the wafer W is to be transferred. Herein, the module precedent to the unavailable module by one is a module that performs a precedent step in the transfer recipe.

(1-b) When the module to which the wafer W subsequent to the wafer W is to be transferred is an unavailable module, another module to which a further subsequent wafer W is to be transferred is searched. The searched available module is determined as a destination module. The case in which a module to which the wafer W subsequent to the wafer W is to be transferred is an unavailable module means a case in which the destination module changed in the step (1-a) is also an unavailable module.

(1-c) When a precedent wafer W is not yet ready to be unloaded from the destination module as determined above, the transfer cycle proceeds until the wafer W becomes ready to be unloaded, without making standby the transfer arms A1 to A4.

Each of the blocks B1 to B4 is provided with a loading stage for loading a wafer W thereinto, and an unloading stage for unloading the wafer W therefrom. A time point at which each of the transfer arms A1 to A4 starts an access to the loading stage corresponds to a "starting time point of the transfer cycle", and a time point at which each of the transfer arms A1 to A4 finishes an access to the unloading stage corresponds to a "finish time point of the transfer cycle". Thus, the "module on the upstream end of the transfer cycle" is the loading stage. "To be located on the downstream side of the unavailable module" means a time from the time when the transfer arm accesses the unavailable module to the time when the transfer arm finishes to access the unloading stage. In the COT layer B3, when the transfer recipe shown in FIG. 6 is set, for example, the transfer modules CPL 31 to 33 correspond to the loading stage, and the transfer module BF3 correspond to the unloading stage, respectively.

On the other hand, in the case (2), upon generation of an unavailable module, when the transfer cycle has been already started, and the transfer arms A1 to A4 are located on the upstream side of the unavailable module in the transfer cycle, a new transfer schedule is made such that the following conditions are satisfied. Herein, "when the transfer cycle has been already started, and the transfer arms A1 to A4 are located on the upstream side of the unavailable module" means a time period from the time when the transfer arms A1 to A4 access the loading stage, to the time when the transfer arms A1 to A4 has accessed the unavailable module.

(2-a) A destination of a wafer W, which is to be loaded into the unavailable module and is now placed on a module precedent to the unavailable module by one, is changed to a module to which a wafer W subsequent to the wafer W is to be transferred.

(2-b) When the module to which the wafer W subsequent to the wafer W is to be transferred is an unavailable module, another module to which a further subsequent wafer W is to be transferred is searched. The searched available module is determined as a destination module.

(2-c) When an precedent wafer W is not yet ready to be unloaded from the destination module as determined above, the transfer operation of the transfer arm A3 is made standby on the upstream side of at least the module determined as the destination.

Figure 8:
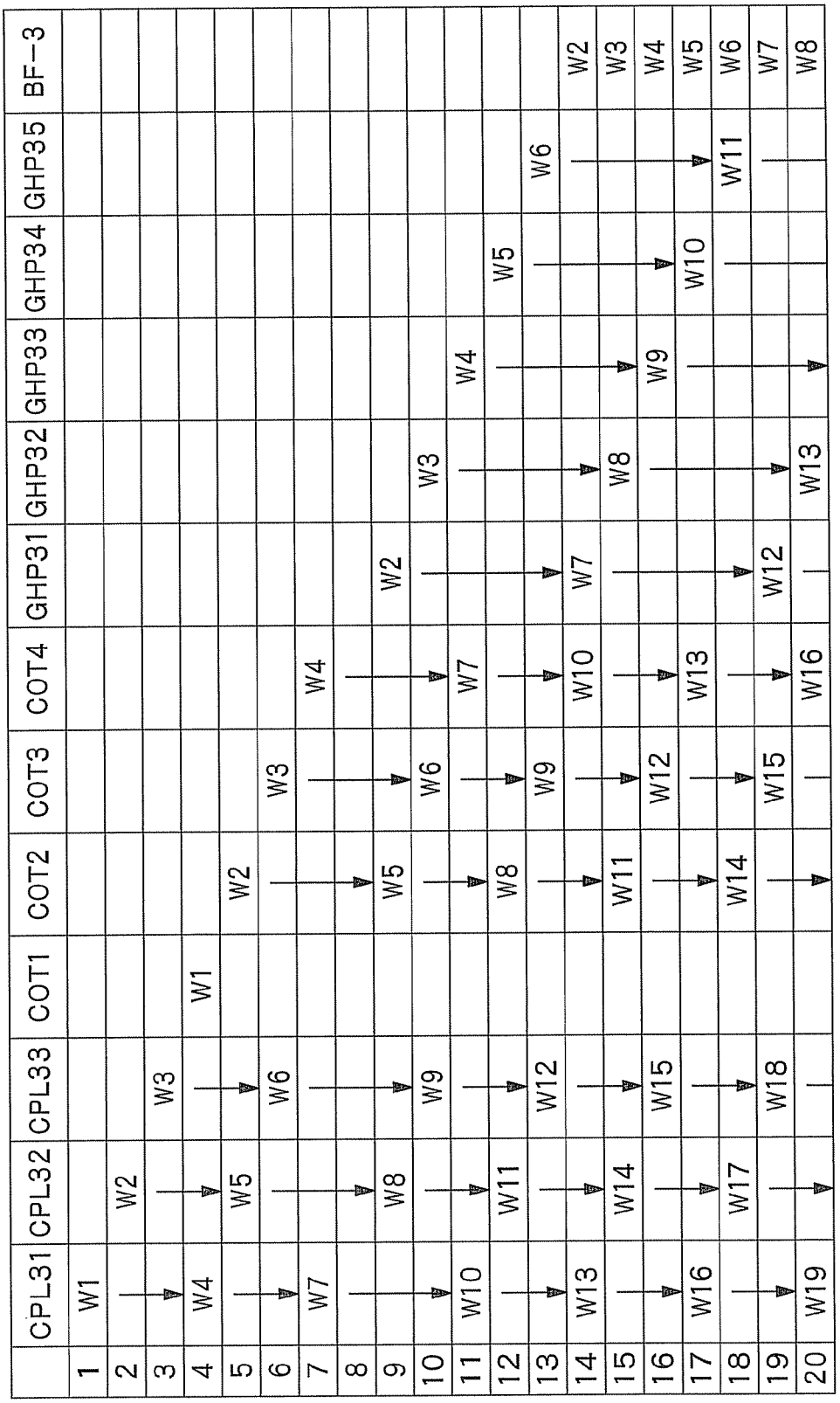
FIG. 8 is an explanatory view showing an example of the transfer schedule example in the third block.

The changed transfer schedule is described in more detail. FIG. 8 shows a case in which the COT1 becomes an unavailable module before a fifth wafer W5 in a lot is transferred to the COT 1, taking the step (1-a) in the case (1) by way of example. Since the transfer schedule on the downstream side of the COT1 holds true with the case (2), the transfer schedule of the case (2) is omitted.

In this case, the destination of the wafer W5, which is to be loaded into the unavailable module (COT1) and is now placed on the module (CPL32) of the multi-module (CPL31 to CPL33), which is precedent to the multi-module (COT1 to COT4) including the unavailable module, is changed to the module (COT2) to which a wafer W6 subsequent to the wafer W5 is to be loaded. Regarding wafers subsequent to the wafer W6, the destinations are sequentially changed. Namely, the destination of the subsequent wafer 6 is changed to the module (COT3) to which a subsequent wafer W7 is to be loaded.

When a precedent wafer W2 is not yet ready to be unloaded from the destination module (COT2) as determined above, the transfer cycle proceeds until the wafer W2 becomes ready to be unloaded, without making standby the transfer arm A3. Thus, in the case (1), after the wafer W5 has been made standby in the origination module (CPL32) up to the cycle 9, the wafer W5 is transferred to the destination module (COT2).

The schedule is changed such that wafer W6 and all the wafers subsequent thereto are not transferred to the COT1. At this time, the number of the modules in the multi-module (COT) is reduced to three. Thus, in order that a wafer W8 is transferred to the COT2 in a cycle 12, the transfer schedule is changed such that the number of cycles staying in the module is reduced from three to two.

In the case (2), when the precedent wafer W is not yet ready to be unloaded from the destination module as determined above, the transfer operation of the transfer arm A3 is made standby on the upstream side of at least the module (COT2) determined as the new destination.

Figure 9:
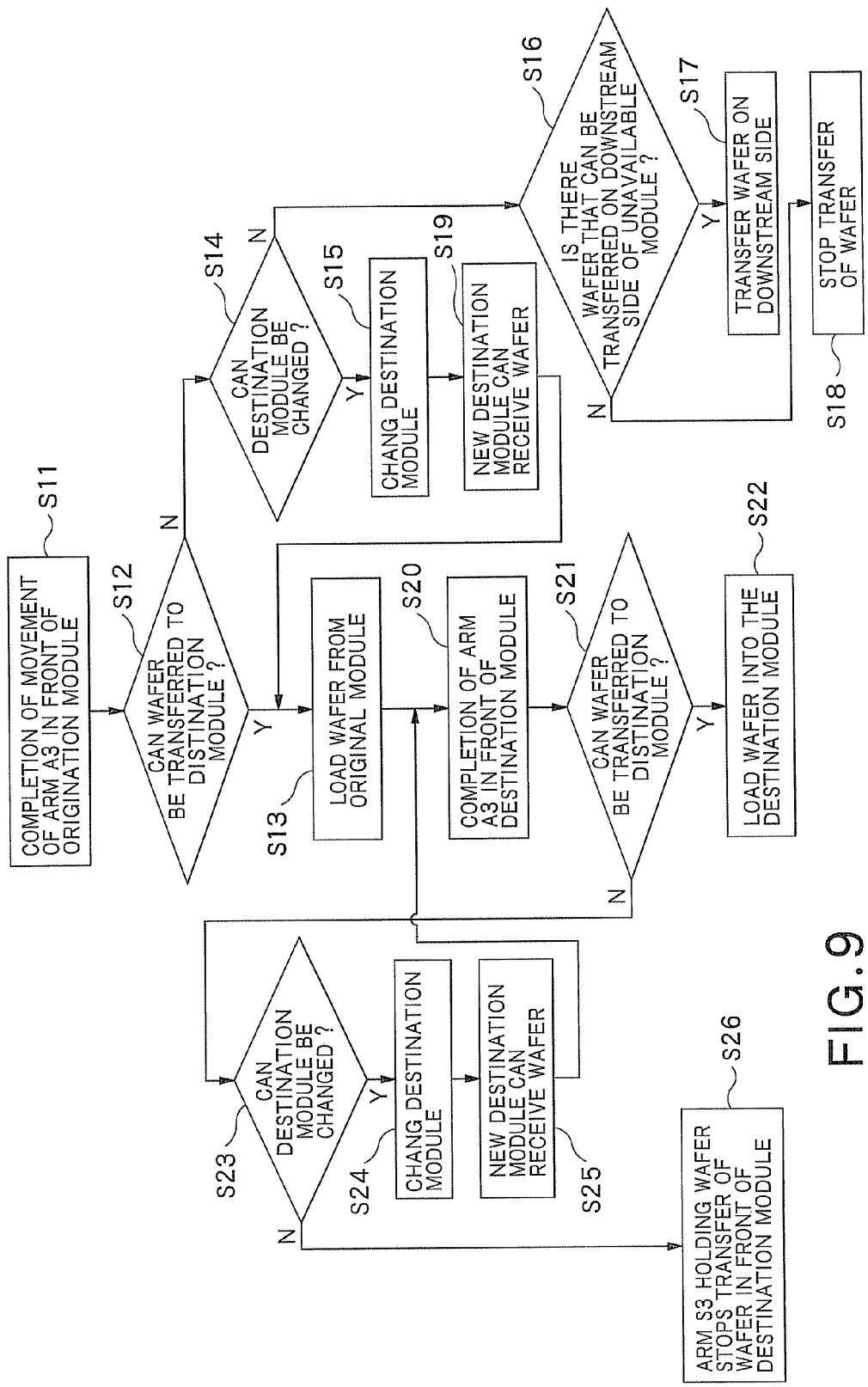
FIG. 9 is a flowchart of a process performed by the resist-pattern forming apparatus.

The control part 3 is configured to perform the operations of the cases (1) and (2), when at least one of the plurality of modules constituting the multi-module becomes an unavailable module and at least one of module is available. Next, the operation of this embodiment is described by taking the COT layer B3 by way of example, with reference to the flowchart shown in FIG. 9. Prior to starting of a process to wafers W as substrates, an operator selects a process recipe, a transfer recipe and a transfer schedule. Thus, the wafers W are transferred by the transfer arm A3 in accordance with the normal transfer schedule. When the movement of the transfer arm A3 to the front of an origination module has been completed (step S11), it is judged that the wafer W can be transferred to a destination module or not (step S12). If YES, the program proceeds to a step 13. If NO, the program proceeds to a step S14.

In the step S14, whether the destination module can be changed or not. If YES, the program proceeds to a step S15. If NO, it is judged whether there is a wafer W which can be transferred to a module on the downstream side of the unavailable module. If YES, the wafer W on the downstream side is transferred (step S17). If NO, the transfer of the wafer W is stopped (step S18).

On the other hand, if the step S14 judges YES (the destination module can be changed), a new transfer schedule is made in the step S15, and the destination module is changed. When the new destination module becomes ready to receive a wafer W transferred thereto (step S19), the wafer W is unloaded from the origination module in the step S13. The case in which the module becomes ready to receive a wafer W transferred thereto means a case in which the precedent wafer W placed in the new destination module can be unloaded therefrom, as long as the transfer arm A3 is accessible to the destination module.

Then, the transfer arm A3 is moved to the front of the destination module (step S20), and it is again judged whether the wafer W can be transferred to the destination module (step S21). If YES, the program proceeds to a step S22, and the wafer W is loaded into the destination module. If NO, the program proceeds to a step S23, and it is judged whether the destination module can be changed or not. If YES, the program proceeds to a step S24, and a new transfer schedule is made so as to change the destination module. When the new destination module becomes ready to receive a wafer transferred thereto (step S25), the program returns to the step S20, and the transfer operation is continued. If NO, the program proceeds to a step S26, and the transfer operation by the transfer arm is stopped, while the wafer W is being held by the transfer arm in front of the destination module.

Figure 10:
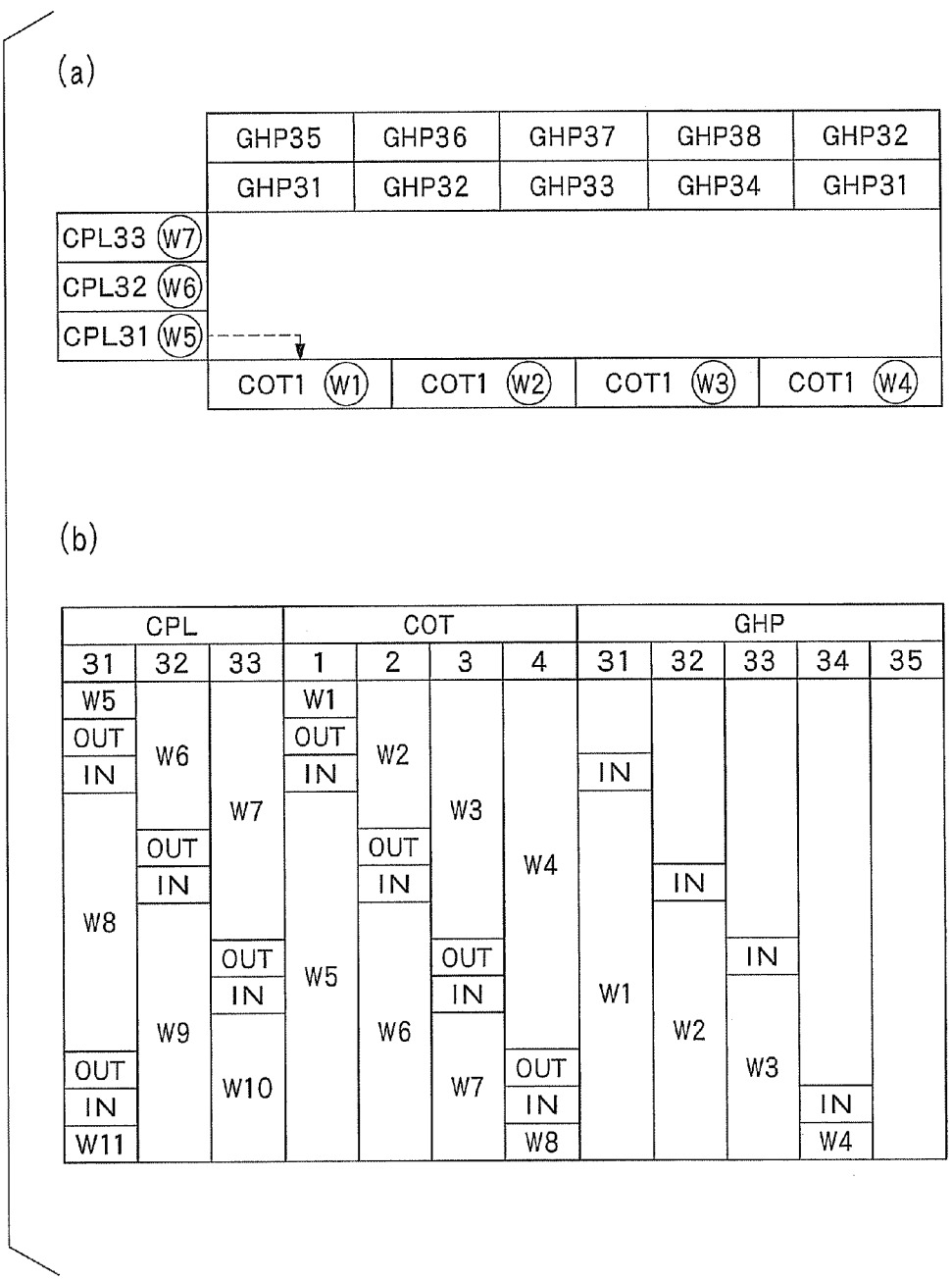
FIGS. 10(a) and 10(b) are explanatory views showing an example of the wafer transfer and an example of the transfer schedule in the third block.

Next, discrete cases are described. As shown in FIG. 10(a), there is explained a case in which the origination module is the CPL31, the destination module is the COT1, and a trouble occurs in the COT1 before the wafer W5 is transferred to the COT1. FIG. 10(b) shows a part of the normal transfer schedule.

The condition of the step (1-a) of the case 1 is described at first. After the transfer arm A3 has been moved to the front of the origination module (CPL31), it is confirmed whether the wafer W5 can be transferred or not to the destination module (COT1). When the COT1 is judged as an unavailable module, the transfer schedule is changed to a new transfer schedule shown in FIG. 11(a) as described above, and the destination is changed to the COT2 as a new destination module. Then, when the COT2 becomes ready to receive the wafer W5 transferred thereto, the wafer W5 is unloaded from the CPL31 and is transferred to the front of the COT2. Then, the wafer W5 is loaded into the COT2. Regarding the wafers W subsequent to the wafer W5, the transfer schedule has been changed such that each subsequent wafer W is similarly transferred the new transfer module. In the case 1, the wafer W waits the transfer thereof in the CPL31 as the origination module, and the wafer W1 in the COT has been unloaded therefrom.

The condition of the step (2-a) of the case 2 is described. After the wafer W5 has been unloaded from the origination module (CPL31) and the wafer W5 has been moved to the front of the destination module (COT1), it is confirmed whether the wafer W5 can be transferred or not to the COT1. When the COT1 is judged as an unavailable module, the transfer schedule is changed to a new transfer schedule shown in FIG. 11(b) as described above, and the destination is changed to the COT2 as a new destination module. Then, when the COT2 becomes ready to receive the wafer W5 transferred thereto, the wafer W5 is moved to the front of the COT2, and the wafer W5 is loaded into the COT2. Regarding the wafers subsequent to the wafer W5, the transfer schedule has been changed such that each subsequent wafer W is similarly transferred the new transfer module. In the transfer schedule shown in FIG. 11(b), "WAIT" means a cycle in which the transfer of the wafer W is made standby. In the case 2, the wafer W waits in front of the COT1 having the trouble, while the wafer W is being held by the transfer arm A3. The wafer W1 in the COT1 is not unloaded from the COT1 but remains in the COT1.

In this embodiment, when at least one of the plurality of modules constituting the multi-module becomes an unavailable module and at least one of the modules is available, the destination of the wafer W, which is to be transferred to the unavailable module and is placed on the module (module from which the wafer is transferred (origination module)) precedent to the unavailable module by one, is changed to the module to which a wafer W subsequent to the wafer W is to be transferred. Thus, the transfer of the wafers W can be promptly performed.

Figure 7:
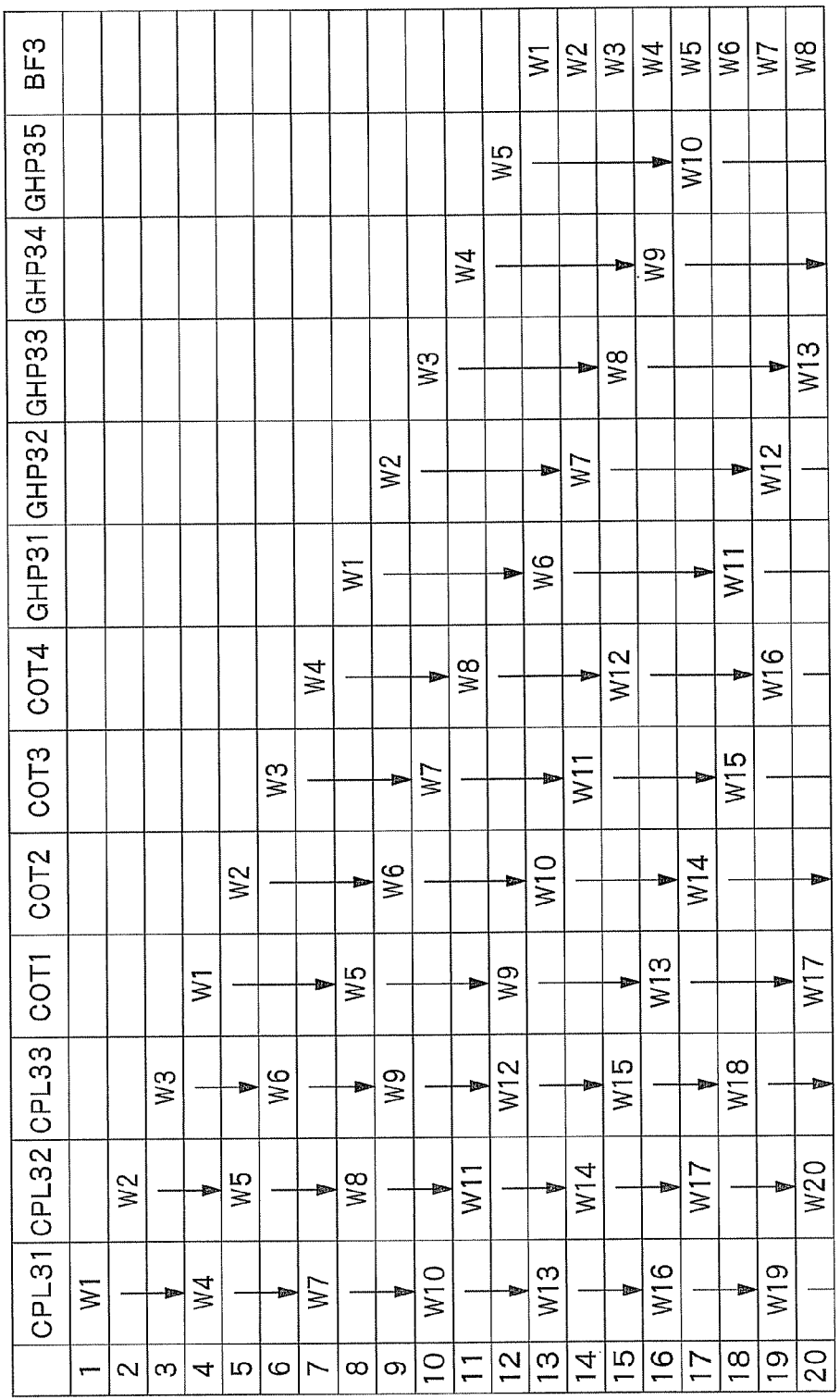
FIG. 7 is a an explanatory view showing an example of a transfer schedule in the third block.

Namely, as shown in the normal transfer schedule in FIG. 7, in the normal condition, for example, the wafer W5 is transferred to the COT1 in the cycle 8, and is transferred to the BF3 in the cycle 17. On the other hand, when the COT1 becomes an unavailable module, as shown in FIG. 8, for example, the wafer W5 is transferred to the COT2 in the cycle 9, and the wafers W subsequent to the wafer W5 are respectively transferred in the respective subsequent cycles. Thus, although the wafers W subsequent to the wafer W5 should wait by a time period corresponding to one cycle, the wafers W can be smoothly, promptly transferred, without stopping the transfer thereof in the course of the process.

Therefore, it can be prevented that the wafers W stagnate in the heating modules GHP, and overheated in the modules. As a result, deterioration in film quality, which results in inferior wafers as products, can be prevented.

As described above, since the number of the available COTs in the transfer schedule is reduced, the transfer schedule is changed such that the number of cycles of the wafers W staying in the COTs is reduced. Thus, the wafers W subsequent to the wafer W2 can be transferred to the BF3 in the cycle 14 similarly to the normal condition. Therefore, the transfer of the wafers W to and from the other blocks B1, B2 and B4 is not delayed, whereby the wafers W can be promptly transferred.

When an unavailable module generates, the movement of the transfer arm is differently controlled in the discrete cases 1 and 2, depending on the position of the transfer arm that transfers the wafers W with respect to the unavailable module. Thus, regardless of any timing at which an unavailable module generates, it is easy to control the transfer arm.

In the above embodiment, as described in the step (1-a) of the case 1 and the step (2-b) of the case 2, when a new destination that is changed in the step (1-a) is an unavailable module, another module to which a subsequent wafer W is to be transferred is searched, and the searched available module is determined as a destination module. Regarding this example, there is described a case in which the COT1 and the COT2 become unavailable modules, for example, before the wafer W5 is transferred to the COT1, with reference to a new transfer schedule shown in, FIGS. 12(a) and (b).

FIG. 12(a) corresponds to the case (1). The COT1 and the COT2 have been unavailable, before the wafer W5 is unloaded from the origination module. In general, a new destination of the wafer W5 is changed to the COT2 to which the subsequent wafer W6 is to be transferred. However, since the COT2 is the unavailable module, the transfer schedule is changed such that a new destination of the wafer W5 is changed to the COT3 to which the further subsequent wafer W7 is to be transferred. The wafer W5 is made standby in the origination module CPL31, until the COT3 becomes ready to receive the wafer W5 transferred thereto. After the precedent wafer W3 has been unloaded from the COT 3, the wafer W5 is loaded into the COT3. The transfer schedule is changed such that destinations of the wafers subsequent to the wafer W5 are similarly changed, so as to be sequentially transferred to available modules.

FIG. 12(b) corresponds to the case (2). The COT1 and the COT2 become unavailable, after the wafer W5 has been unloaded from the origination module CPL31. In general, a new destination of the wafer W5 is changed to the COT2 to which the subsequent wafer W6 is to be transferred. However, since the COT2 is the unavailable module, the transfer schedule is changed such that a new destination of the wafer W5 is changed to the COT3 to which the further subsequent wafer W7 is to be transferred. The wafer W5 held in the transfer arm A3 is made standby on the upstream side of the new destination module COT3, until the COT3 becomes ready to receive the wafer W5 transferred thereto. After the precedent wafer W3 has been unloaded from the COT 3, the wafer W5 is loaded into the COT3. The transfer schedule is changed such that destinations of the wafers subsequent to the wafer W5 are similarly changed, so as to be sequentially transferred to available modules.

Regarding a case in which all the modules of the multi-module become unavailable modules, the control part 3 is configured to control the transfer arm in the following manner. Namely, when all the destination modules become unavailable before a wafer W is unloaded from an origination module, the wafer W is controlled so as not to be unloaded from the origination module. On the other hand, all the destination modules become unavailable after a wafer W has been unloaded from an origination module, the wafer W held by the transfer arm is controlled to be stopped in front of the destination module.

In a case in which the number of the module set in the same step in the transfer recipe is one, when this module becomes an unavailable module, the control part 3 is configured to control the transfer arm in the following manner. Namely, the destination module becomes unavailable before the wafer W is unloaded from the origination module, the wafer W is controlled to be not unloaded from the origination module. On the other hand, when the destination module becomes unavailable after the wafer W has been unloaded from the origination module, the wafer W held by the transfer arm is controlled to be stopped in front of the destination module.

Figure 13:
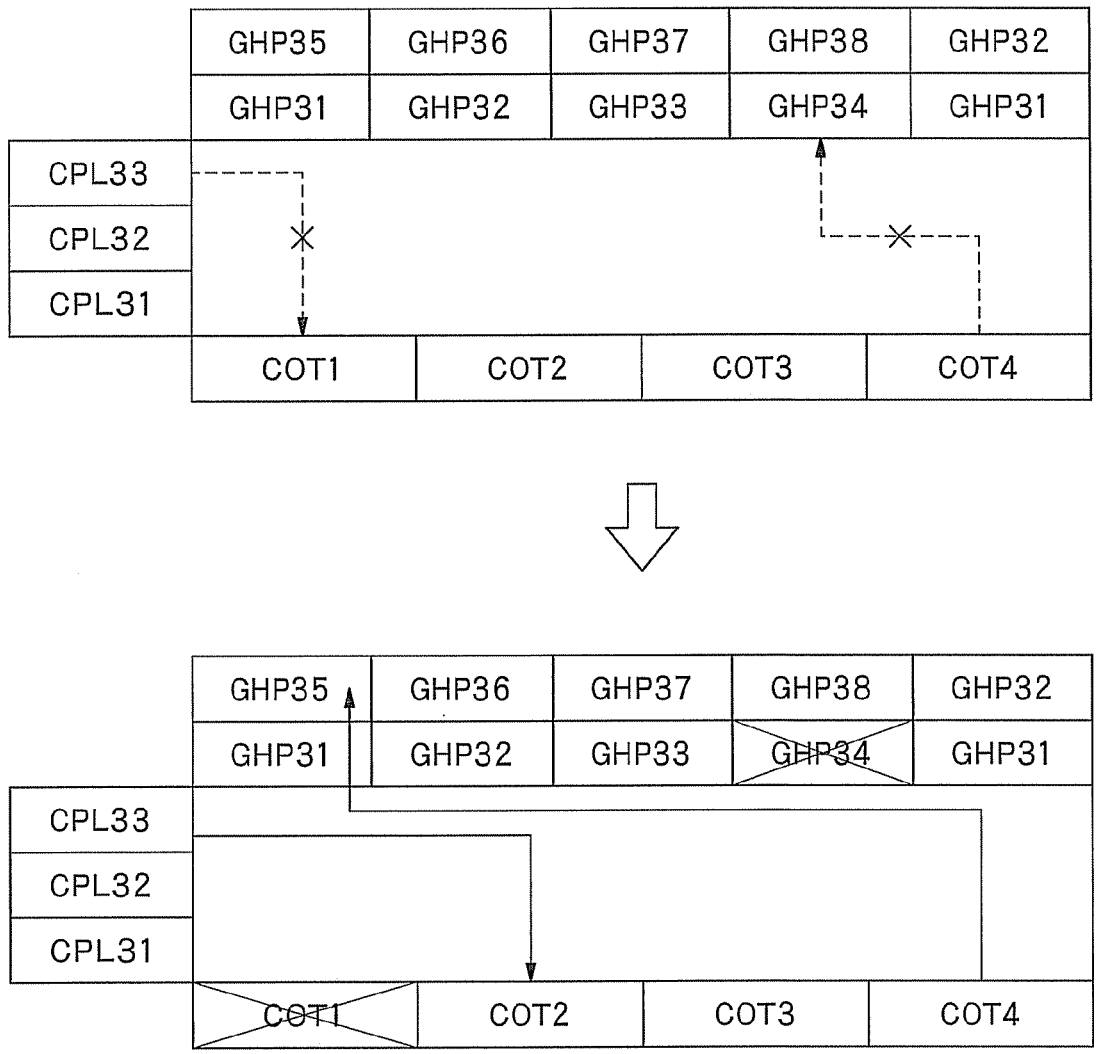
FIG. 13 is a an explanatory view showing an example of the wafer transfer in the third block.

In addition, there is described a case in which a plurality modules that carry out different steps of the transfer recipe become unavailable modules in the same block. In this case, the control part 3 is configured to control the transfer of wafers W in the following manner. Namely, when a module set in the same step as the unavailable module is available, the transfer of the wafers W is controlled such that new destinations of the wafers W are changed to destinations of the subsequent wafers W in the normal condition. For example, FIG. 13 shows a case in which the COT1 and the GHP34 become unavailable modules in the COT layer B3. In this case, the transfer of the wafer W is controlled such that new destinations of the wafers W are changed to the COT2 and GHP35 to which the subsequent wafers W are to be transferred in the normal condition.

Figure 14:
FIG. 14 is an explanatory view showing an example of the wafer transfer in the third block and a fourth block of the resist-pattern forming apparatus.

In addition, there is described a case in which a plurality of modules become unavailable modules in different blocks. In this case, the control part 3 is configured to control the transfer of wafers W in the following manner. Namely, when a module set in the same step as the unavailable module is available, the transfer of the wafers W is performed such that new destinations of the wafers W are changed to destinations of the subsequent wafers W in the normal condition. For example, FIG. 14 shows a case in which the COT1 in the COT layer 3 and GHA42 in the TCT layer B4 become unavailable modules. In this case, the transfer of the wafers W is controlled such that new destinations of the wafers W is changed to the COT2 and the GHA43 to which the subsequent wafers W are to be transferred in the normal condition.

The module groups for forming a coating film on a substrate before exposure include, in addition to the module group of the third block (COT layer) B3, the module group of the second block (BCT layer) B2 for forming an anti-reflection film below a resist film, and the module group of the fourth block (TCT layer) B4 for forming an anti-reflection film above the resist film. A module group for performing a process, including a developing process, to a substrate after exposure corresponds to the module group of the first block (DEV layer) B1. In the blocks B1, B2 and B4 other than the COT layer B3, the transfer of wafers W is performed similarly to the transfer of wafers W in the COT layer B3.

Figure 15:
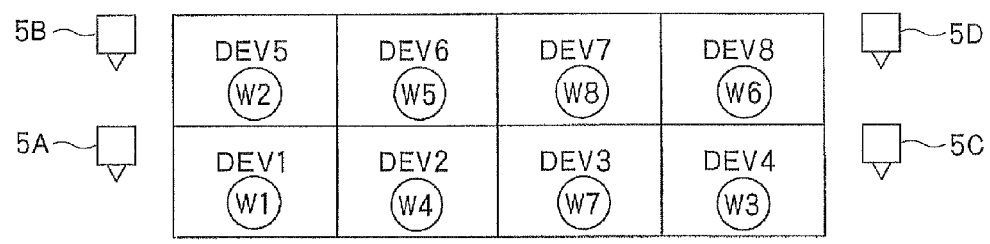
FIG. 15 is an explanatory view showing an example of the wafer transfer in a first block of the resist-pattern forming apparatus.

In the DEV layer B1, the liquid processing modules DEVs are arranged at two levels. The transfer of wafers W in the DEV layer B1 is briefly described. As shown in FIG. 15, there is described a case in which the four liquid processing modules 4 are arranged at each level, i.e., the eight liquid processing modules DEV1 to DEV8 in total are arranged, for example. Similarly to the COT layer B3, in the DEV layer B1, each of the liquid processing modules DEV1 to DEV8 includes therein a substrate holding part in which a substrate is placed substantially horizontally, and a cup surrounding the substrate holding part. The substrate holding part is referred to as "module".

In FIG. 15, the reference numbers 5A to 5D depict processing nozzles for supplying a developer onto wafers W on the substrate holding parts. The respective processing nozzles are disposed on opposed sides of each level. Which processing nozzle is used is set by a setting of the transfer recipe. In each level, it is possible to set such that both the processing nozzles are used, and that one of the processing nozzles is used. For example, when the processing nozzles on both sides are used depending on a transfer recipe, the DEV1, the DEV2 and the DEV3 are processed by using the nozzle 5A, the DEV5, the DEV6 and the DEV7 are processed by using the nozzle 5B, and the DEV4 and the DEV8 are processed respectively by the two nozzles 5C and 5D.

The numbers in the parenthesis described in the respective modules DEV1 to DEV8 show the loading order of wafers W. By loading the wafers W in this order, the wafers W can be prevented from being continuously loaded into the modules using the common nozzle, i.e., among the DEV1, DEV2 and DEV3, and among the DEV5, DEV6 and the DEV7, whereby the transfer cycle becomes vacant for a plurality of times, in this example, two cycles. Since the transfer cycle becomes vacant, in the modules using the common nozzle, while a developing process is performed in one module, wafers W can be loaded and unloaded to and from the other modules. That is to say, in the modules using the common nozzle, since the delay of starting the process, because of the use of the common nozzle, can be prevented, the developing process can be smoothly performed.

Figure 16:
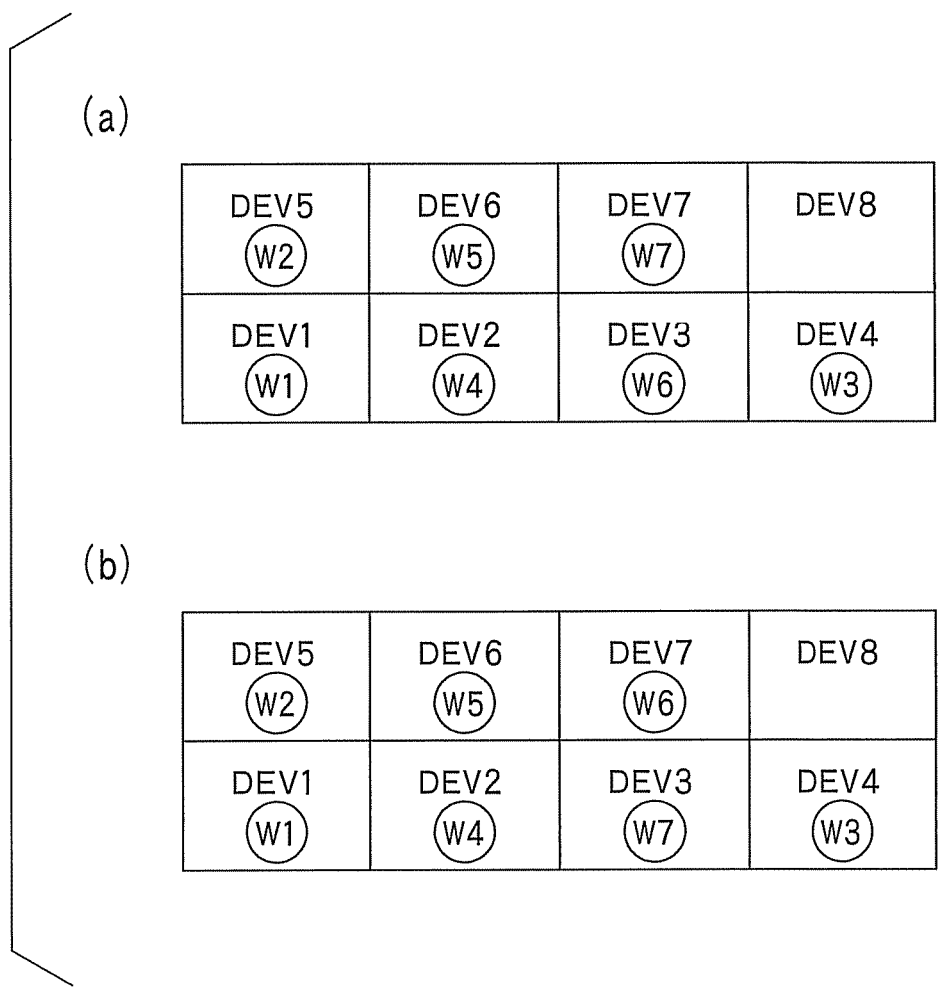
FIGS. 16(a) and 16(b) are explanatory views showing an example of the wafer transfer in the first block.
Figure 18:
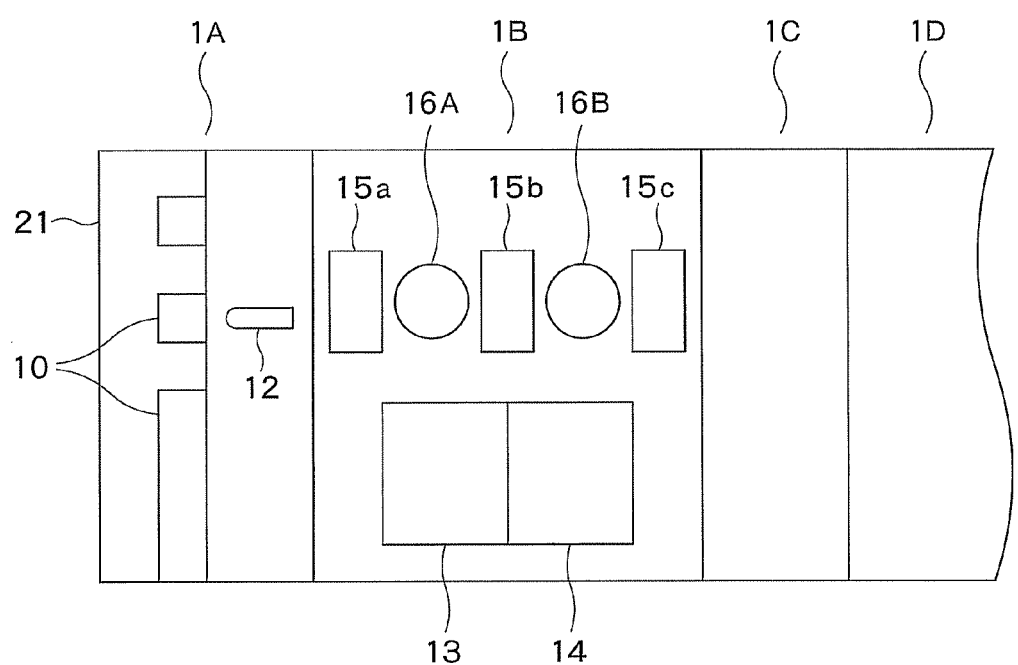
FIG. 18 is a plan view showing an example of a conventional resist-pattern forming apparatus.

When a developing process is performed by using the structure shown in FIG. 15, for example, the wafer W1 is transferred to the DEV1, the wafer W2 is transferred to the DEV5, the wafer W3 is transferred to the DEV4, the wafer W4 is transferred to the DEV2, the wafer W5 is transferred to the DEV6, the wafer W6 is transferred to the DEV8, the wafer W7 is transferred to the DEV3, and the wafer W8 is transferred to the DEV7. As shown in FIG. 16(a), when the DEV8 becomes an unavailable module before the wafer W6 is transferred to the DEV8, the destination of the wafer W6 is changed to the DEV3 to which the subsequent wafer W7 is to be transferred. Similarly, the transfer of the wafers W subsequent to the wafer W6 is controlled by the control part 3 such that the destinations of the wafers W are sequentially changed to the modules to which the subsequent wafers W are to be transferred.

Thus, between the modules using the common nozzles, even after the DEV8 has become unavailable, the transfer cycle of one cycle becomes vacant without continuously loading the wafers W, whereby the developing process can be smoothly continued, as described above. When the destinations are merely changed to the adjacent modules, as shown in FIG. 16(b), the wafer W6 is loaded into the DEV7, and the wafer W7 subsequent to the wafer 6 is loaded into DEV3 as illustrated. However, in this case in FIG. 16(b), the continuous wafers W5 and W6 are loaded into the DEV6 and the DEV7 using the common nozzle. Thus, a waiting time is necessary before the wafer W6 is loaded into the DEV7, whereby the smooth transfer becomes discontinuous.

In the above embodiment, in a case in which a destination module M1 become an unavailable module before a wafer Wn is transferred to the destination module M1, and a destination is newly changed to a destination module M2, when a process recipe R2 in the module M2 differs from a process recipe R1 in the original destination module Ml, the control is performed by the control part 3 such that, after the new destination has been changed to the module M2, the process recipe R1 is forwarded from the control part 3 to the module M2, and that the wafer Wn is thereafter transferred to the module M2.

When an unavailable module generates in the above apparatus, there may be a lot from which wafers W are in the course of being taken out from the carrier block S1. Such a lot is controlled such that the wafers W are continuously taken out. On the other hand, regarding a lot from which wafers W are not yet taken out from the carrier block S1, the taking-out operation may be continued or stopped.

Regarding a dummy dispense in the above apparatus, a control command is outputted from the control part 3 in the following manner. In a case where an unavailable module generates, when a dummy dispense is necessary in a module other than the unavailable module before a first wafer W in a lot is transferred, the transfer of the wafers W is controlled to be started after the dummy dispense has been finished. Regarding a dummy dispense of the unavailable module, in a case in which a dummy dispense is necessary in a common nozzle, when one of the modules using the common nozzle is an available module, the dummy dispense is controlled to be performed. On the other hand, regarding the nozzle other than the common nozzle in the unavailable module, even when a dummy dispense becomes necessary, the dispense is controlled to be not performed. Regarding an available module belonging to the same module group as that of an unavailable module, when a dummy dispense becomes necessary in a nozzle other than a common nozzle, the dispense is controlled to be performed.

When a further unavailable module generates in a multi-module already including an unavailable module, if there is an available module, the transfer is controlled to be continued by using the module. If there is no available module, the transfer of wafers W is controlled to be stopped. At this time, when the transfer arms A1 to A4 do not hold a wafer W, the transfer of the wafers on the downstream side of the unavailable module is controlled to be continued.

When an unavailable module recovers so as to become an available module, the control part 3 controls the transfer of wafers to be started from the wafer W which is transferred to a multi-module including the unavailable module, at a time point when the unavailable module becomes the available module. The fact of the recovery of the module may be outputted to the control part 3 via the controller Co from each module M, or the recovery of the module may be inputted by an operator.

There is described a case in which, for example, the COT4 is an unavailable module but recovers to an available module before the wafer W4 is transferred, with reference to FIGS. 17(a) and (b). FIG. 17(a) shows the order of transfer of the wafers W before the COT4 recovers to an available module. The wafer W4 in the CPL31 as an origination module is transferred to the COT1, and the wafer W5 in the CPL32 is transferred to the COT2, and the wafer W6 in the CPL33 is transferred to the COT3.

On the other hand, FIG. 17(b) shows the order of transfer of the wafers W after the COT4 has recovered to an available module. At a time point when the COT4 becomes available, the wafer 4 and the subsequent wafers which are not transferred to the multi-module including the COT4 are sequentially transferred to the COT4. In this manner, from a time point when the unavailable module becomes available, the transfer of the wafers W to the module is restarted. Thus, since the module can be used immediately after the module becomes available, a throughput can be improved.

The present invention can be applied to a coating and developing apparatus that processes, not only a semiconductor wafer, but also a substrate such as a glass substrate (LCD substrate) for a liquid crystal display.

The invention claimed is:

1. A substrate processing apparatus comprising:
a plurality of module groups each including a plurality modules, at least one module group including a multi-module having a plurality of modules configured to perform the same process to substrates;
a transfer unit configured to take out substrates from modules on an upstream side of the multi-module, to transfer the substrates to modules in the multi-module, and to take in the substrates to the respective modules in the multi-module in order;
a storage part storing a transfer schedule including a transfer cycle by which the substrates are transferred by the transfer unit to the respective modules in the multi-module; and
a control part that controls the transfer unit based on the transfer schedule in the storage part;
wherein, when at least one of the modules constituting the multi-module is an unavailable module and at least one of the modules is an available module, the control part is configured to perform the following operations (2):

(2) upon generation of the unavailable module, when the substrate to be loaded into the unavailable module has been made to standby in a module that is one module ahead of the unavailable module, and when the transfer cycle has been already started, the transfer unit is located on the upstream side of the unavailable module in the transfer cycle:
(2-a) a destination of the substrate, which is to be loaded into the unavailable module and is now placed on a multi-module on the upstream side of the multi-module, is changed to a module in the multi-module, to which a substrate subsequent to the substrate is to be transferred;
(2-b) when the module to which the substrate subsequent to the substrate is to be transferred is an unavailable module, another module to which a further subsequent substrate is to be transferred is searched so as to find an available module, and the available module is determined as the destination; and
(2-c) when a precedent substrate is not yet ready to be unloaded from the destination module as determined above, the transfer operation of the transfer unit is made to standby on the upstream side of the module determined as the destination.

2. The substrate processing apparatus according to claim 1, wherein:
the module groups include a module group for forming a coating film on a substrate before exposure, and a module group for performing a process, including a developing process, to a substrate after exposure;
the transfer unit includes a transfer unit for the module group for forming a coating film, and a transfer unit for the module group for performing a process including a developing process; and
the module group including the multi-module is the module group for forming a coating film on a substrate before exposure.

3. The substrate processing apparatus according to claim 1, wherein:
the module groups include a module group for forming a coating film on a substrate before exposure, and a module group for performing a process, including a developing process, to a substrate after exposure;
the transfer unit includes a transfer unit for the module group for forming a coating film, and a transfer unit for the module group for performing a process including a developing process; and
the module group including the multi-module is the module group for performing a process including a developing process.

4. A substrate processing method of a substrate processing apparatus comprising a plurality of module groups each including a plurality modules, at least one module group including a multi-module having a plurality of modules configured to perform the same process to substrates; a transfer unit configured to take out substrates from modules on an upstream side of the multi-module, to transfer the substrates to modules in the multi-module, and to take in the substrates to the respective modules in the multi-module in order; a storage part storing a transfer schedule including a transfer cycle by which the substrates are transferred by the transfer unit to the respective modules in the multi-module; and a control part that controls the transfer unit based on the transfer schedule in the storage part;
the substrate processing method comprising:
controlling the transfer unit based on the transfer schedule in the storage part, such that substrates are taken out from modules on the upstream side of the multi-module, that the substrates are transferred to modules in the multi-module, and that the substrates are transferred to the respective modules in the multi-module in order; and when at least one of the modules constituting the multi-module is an unavailable module, and at least one of the modules is an available module, performing the following operations (2):

(2) upon generation of the unavailable module, when the substrate to be loaded into the unavailable module has been made to standby in a module that is one module ahead of the unavailable module, and when the transfer cycle has been already started, and the transfer unit is located on the upstream side of the unavailable module in the transfer cycle:

(2-a) a destination of the substrate, which is to be loaded into the unavailable module and is now placed on a multi-module on the upstream side of the multi-module, is changed to a module in the multi-module, to which a substrate subsequent to the substrate is to be transferred;

(2-b) when the module to which the substrate subsequent to the substrate is to be transferred is an unavailable module, another module to which a further subsequent substrate is to be transferred is searched so as to find an available module, and the available module is determined as the destination;

(2-c) when a precedent substrate is not yet ready to be unloaded from the destination module as determined above, the transfer operation of the transfer unit is made to standby on the upstream side of the module determined as the destination; and (2-d) the transfer schedule is changed such that a number of cycles of the substrate to be loaded into the unavailable module, which is staying in the available module determined by (2-a) and (2-b), is reduced from the number of cycles when the unavailable module is not generated by the number of unavailable modules.

* * * * *